US011143719B2

(12) United States Patent
Shimizu et al.

(10) Patent No.: US 11,143,719 B2
(45) Date of Patent: Oct. 12, 2021

(54) MAGNETIC SENSOR AND CURRENT SENSOR

(71) Applicant: Murata Manufacturing Co., Ltd., Nagaokakyo (JP)

(72) Inventors: Yasuhiro Shimizu, Nagaokakyo (JP); Takashi Kawanami, Nagaokakyo (JP); Nobumasa Kitamori, Nagaokakyo (JP); Noritaka Kishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 16/672,558

(22) Filed: Nov. 4, 2019

(65) Prior Publication Data

US 2020/0064417 A1 Feb. 27, 2020

Related U.S. Application Data

(63) Continuation of application No. PCT/JP2018/017997, filed on May 9, 2018.

(30) Foreign Application Priority Data

Oct. 6, 2017 (JP) .............................. JP2017-196373

(51) Int. Cl.
*G01R 33/09* (2006.01)
*G01R 15/20* (2006.01)
*G01R 19/00* (2006.01)
*G01R 33/00* (2006.01)

(52) U.S. Cl.
CPC ........... *G01R 33/09* (2013.01); *G01R 15/205* (2013.01); *G01R 19/0092* (2013.01); *G01R 33/0005* (2013.01)

(58) Field of Classification Search
CPC .... G01R 33/09; G01R 33/0005; G01R 33/06; G01R 15/205; G01R 15/207
See application file for complete search history.

(56) References Cited

U.S. PATENT DOCUMENTS

| | | | |
|---|---|---|---|
| 6,100,686 A | 8/2000 | Van Delden et al. | |
| 9,029,966 B2* | 5/2015 | Motz | G01R 31/2856 |
| | | | 257/427 |
| 9,081,041 B2* | 7/2015 | Friedrich | G01R 15/207 |
| 2010/0045286 A1* | 2/2010 | Hotz | G01R 15/207 |
| | | | 324/260 |

(Continued)

FOREIGN PATENT DOCUMENTS

| | | |
|---|---|---|
| JP | 06-148301 A | 5/1994 |
| JP | 2000-516724 A | 12/2000 |

(Continued)

OTHER PUBLICATIONS

Official Communication issued in International Patent Application No. PCT/JP2018/017997, dated Aug. 7, 2018.

*Primary Examiner* — Dominic E Hawkins
(74) *Attorney, Agent, or Firm* — Keating & Bennett, LLP

(57) ABSTRACT

A magnetic sensor senses a magnetic field in a predetermined magnetic sensing direction. The magnetic sensor includes a chip on which at least one magnetic device is provided. The length of the chip in the magnetic sensing direction is twice or more the length of the chip in an orthogonal direction that is orthogonal or substantially orthogonal to the magnetic sensing direction.

20 Claims, 10 Drawing Sheets

(56) References Cited

U.S. PATENT DOCUMENTS

| | | | |
|---|---|---|---|
| 2011/0285384 A1* | 11/2011 | Nomura | G01R 15/205 |
| | | | 324/117 R |
| 2013/0253864 A1* | 9/2013 | Fujita | G01R 33/0005 |
| | | | 702/65 |
| 2016/0061863 A1 | 3/2016 | Zhang | |
| 2016/0146859 A1* | 5/2016 | Futakuchi | G01R 15/205 |
| | | | 324/117 R |
| 2017/0248445 A1* | 8/2017 | Ausserlechner | G01D 5/145 |
| 2017/0343584 A1* | 11/2017 | Abe | G01R 15/148 |
| 2018/0038898 A1 | 2/2018 | Shimizu | |

FOREIGN PATENT DOCUMENTS

| | | |
|---|---|---|
| JP | 2007-292692 A | 11/2007 |
| JP | 2017-003345 A | 1/2017 |
| WO | 2014/181382 A1 | 11/2014 |
| WO | 2017/010219 A1 | 1/2017 |

\* cited by examiner

MAGNETIC SENSOR AND CURRENT SENSOR

CROSS REFERENCE TO RELATED APPLICATIONS

This application claims the benefit of priority to Japanese Patent Application No. 2017-196373 filed on Oct. 6, 2017 and is a Continuation Application of PCT Application No. PCT/JP2018/017997 filed on May 9, 2018. The entire contents of each application are hereby incorporated herein by reference.

BACKGROUND OF THE INVENTION

1. Field of the Invention

The present invention relates to a magnetic sensor that senses a magnetic field and to a current sensor including the magnetic sensor.

2. Description of the Related Art

Japanese Unexamined Patent Application Publication No. 6-148301 discloses a technique for obtaining good symmetry of outputs of a magnetic sensor with respect to positive and negative sides in a magnetic-field direction. In the magnetic sensor in Japanese Unexamined Patent Application Publication No. 6-148301, a bias magnetic field generating section and a magnetic resistance device are disposed on the same chip. The bias magnetic field generating section on the chip includes two thin-film magnets arranged such that their opposite polarities face each other and they are spaced apart from each other. In the magnetic sensor in Japanese Unexamined Patent Application Publication No. 6-148301, the magnetic resistance device is arranged near the center of the magnetic field caused by the two thin-film magnets on the chip in order to make the direction of the magnetic field from the thin-film magnets for generating the bias magnetic field and the bias magnetic field direction of the magnetic resistance device accurately match with each other.

SUMMARY OF THE INVENTION

Preferred embodiments of the present invention provide magnetic sensors and current sensors that are each able to reduce angular misalignment in the magnetic sensor that senses a magnetic field.

A magnetic sensor according to a preferred embodiment of the present invention is a magnetic sensor that senses a magnetic field in a predetermined magnetic sensing direction. The magnetic sensor includes a chip on which at least one magnetic device is provided. A length of the chip in the magnetic sensing direction is twice or more a length of the chip in an orthogonal direction orthogonal or substantially orthogonal to the magnetic sensing direction.

A current sensor according to a preferred embodiment of the present invention includes a magnetic sensor and a conductor. The magnetic sensor is attached to the conductor, and the conductor allows a current to flow therethrough. The magnetic sensor senses a magnetic field produced by the current.

In the magnetic sensors and current sensors according to preferred embodiments of the present invention, because the length of the chip in the magnetic sensing direction is twice or more the length of the chip in the orthogonal direction, angular misalignment in the magnetic sensor can be reduced.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Preferred embodiments of a magnetic sensor and a current sensor according to the present invention are described below with reference to the drawings.

The preferred embodiments are illustrated as examples, and configurations illustrated in different preferred embodiments can be replaced in part or combined. The description of items common to a first preferred embodiment is omitted in second and subsequent preferred embodiments, and only different points are described. In particular, similar operational advantages produced by similar configurations are not mentioned one by one for each preferred embodiment.

First Preferred Embodiment

1. Features and Elements

Figure 1:
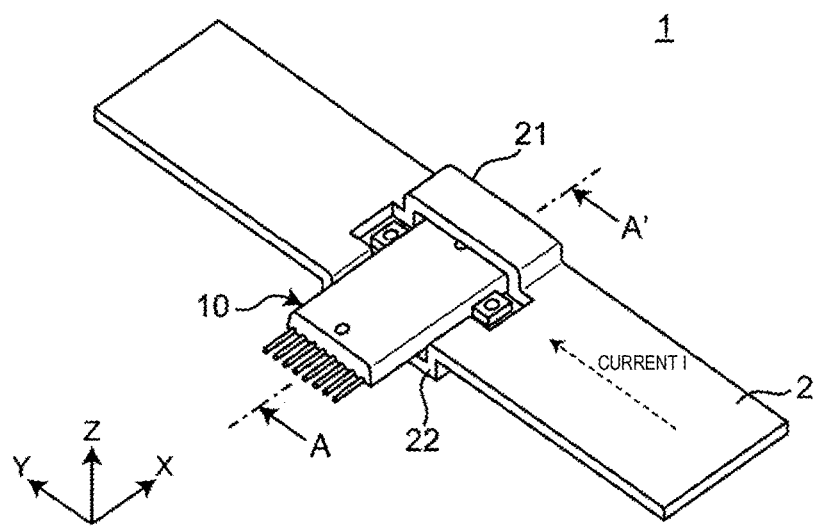
FIG. 1 is a perspective view that shows a current sensor according to a first preferred embodiment of the present invention.
Figure 2:
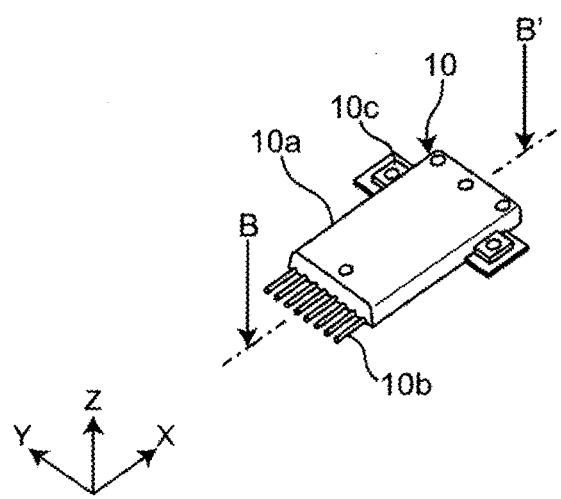
FIG. 2 is a perspective view that shows an outer appearance of a magnetic sensor according to the first preferred embodiment of the present invention.
Figure 3:
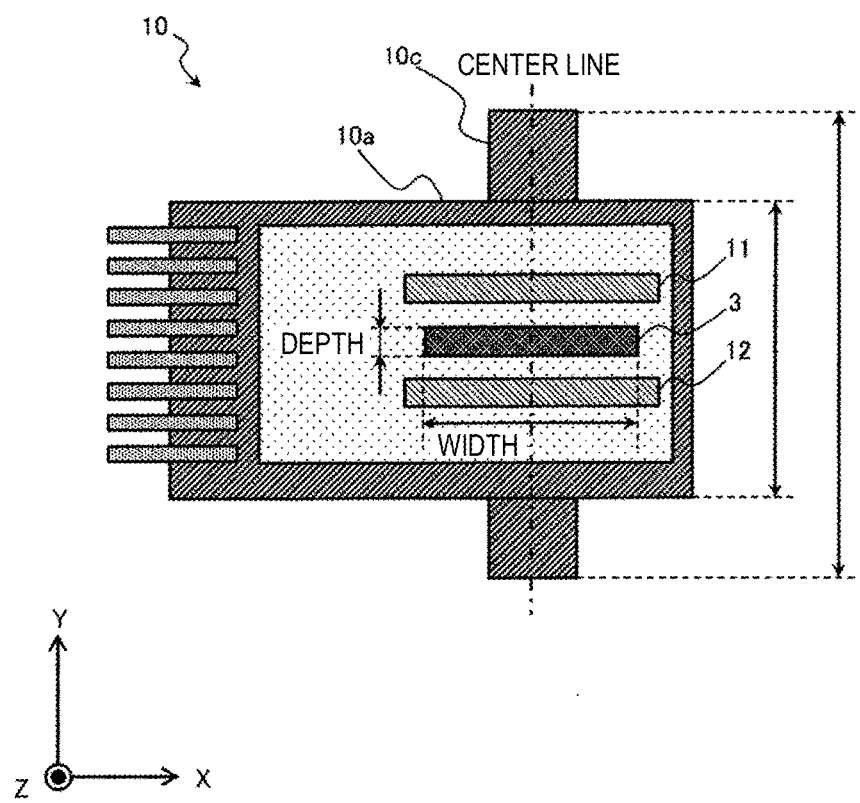
FIG. 3 shows an internal structure of the magnetic sensor according to the first preferred embodiment of the present invention.

A current sensor and a magnetic sensor according to a first preferred embodiment a preferred embodiment of a preferred embodiment described with reference to FIGS. 1 to 3. FIG. 1 is a perspective view that shows a current sensor 1 according to the first preferred embodiment. FIG. 2 is a perspective view that shows an outer appearance of a magnetic sensor 10 according to the first preferred embodiment. FIG. 3 shows an internal structure of the magnetic sensor 10.

As shown in FIG. 1, the current sensor 1 according to the first preferred embodiment includes a busbar 2 and the magnetic sensor 10. The current sensor 1 measures a current I by sensing a magnetic field produced by the current I flowing through the busbar 2 (hereinafter referred to as "signal magnetic field") by using the magnetic sensor 10. The busbar 2 is an example of a conductor that allows the current I, which is a target for measurement, to flow therethrough in a longitudinal direction (Y direction). Hereinafter, the width direction of the busbar 2 is defined as the X direction, its longitudinal direction is defined as the Y direction, and its thickness direction is defined as the Z direction.

The busbar 2 in the first preferred embodiment is divided into two channels 21 and 22 in a portion thereof in the Y direction. As shown in FIG. 1 as an example, when the current I flows through the busbar 2 in the +Y direction, it is split into a portion flowing in the first channel 21 on the +X side and another portion flowing in the second channel 22 on the −X side. The split current portions flow in the +Y direction in both the first channel 21 and second channel 22.

The magnetic sensor 10 is attached to the busbar 2 by, for example, an adhesive, a screw, deposition, welding, or the like. The magnetic sensor 10 is arranged between the first and second channels 21 and 22. The first channel 21 is on the +Z side with respect to the magnetic sensor 10, and the second channel 22 is on the −Z side with respect to the magnetic sensor 10. The outer appearance of the magnetic sensor 10 in a state where it is not attached to the busbar 2 in FIG. 1 is shown in FIG. 2.

As shown in FIG. 2, the magnetic sensor 10 includes a package 10a and terminals 10b. The magnetic sensor 10 can output a signal indicating a result of measurement of the current I and receive electricity through the terminals 10b. The package 10a is an example of a casing of the magnetic sensor 10. The method for packaging the magnetic sensor 10 is not particularly limited, and examples of the packaging method may include molding with resin and metal can packaging. The internal structure of the package 10a in the magnetic sensor 10 is shown in FIG. 3.

FIG. 3 corresponds to a cross section of B-B' in FIG. 2. The B-B' cross section is a cross section of the magnetic sensor 10 taken along the XY plane. In FIG. 3, detailed illustration of various wirings and an operational unit described below is omitted.

As shown in FIG. 3, the magnetic sensor 10 according to the first preferred embodiment includes a sensor chip 3 and bias magnets 11 and 12. The sensor chip 3 is connectable to the terminals 10b with various circuits and the like interposed therebetween.

The sensor chip 3 is a chip on which a magnetic device (details are below) that senses a magnetic field in a predetermined magnetic sensing direction is provided. One example shape of the sensor chip 3 may be a rectangle and have a width and a depth. The magnetic sensing direction in the first preferred embodiment is a direction extending along the width of the sensor chip 3 (width direction). The depth direction of the sensor chip 3 is an example of an orthogonal or substantially orthogonal direction to the width direction.

In FIG. 3, the width direction of the sensor chip 3 corresponds to the X direction, and its depth direction corresponds to the Y direction. In the first preferred embodiment, the use of a dimension sufficiently longer than the depth as the width of the sensor chip 3 can reduce angular misalignment of the sensor chip 3 in the magnetic sensor 10. The details of the sensor chip 3 are described below.

The bias magnets 11 and 12 apply magnetic bias to the magnetic device in the sensor chip 3. Hereinafter, a magnetic field produced from the bias magnets 11 and 12 is referred to as "bias magnetic field." As the bias magnets 11 and 12, for example, bulk magnets, such as ferrite or samarium-cobalt (SmCo) magnets, or various kinds of thin-film magnets can preferably be used. In the first preferred embodiment, the two bias magnets 11 and 12 are opposed to each other and the sensor chip 3 is positioned therebetween (details are below).

As shown in FIGS. 2 and 3, an attachment section 10c is provided on the package 10a in the magnetic sensor 10. As shown in FIG. 1, the attachment section 10c attaches the magnetic sensor 10 along the first and second channels 21 and 22 in the busbar 2.

As shown in FIG. 3, the attachment section 10c protrudes from the package 10a in the depth direction (Y direction) on a center line passing through the central point in the width direction (X direction) of the sensor chip 3. In other words, the length of the package 10a in the magnetic sensor 10 in the depth direction at the attachment section 10c is longer than that at the other portions. The attachment section 10c may be provided on both the +Y and −Y sides of the package 10a. With the attachment section 10c, angular misalignment or rotational misalignment in the magnetic sensor 10 with respect to the busbar 2 can be significantly reduced or prevented.

1-1. About Sensor Chip

Figure 4:
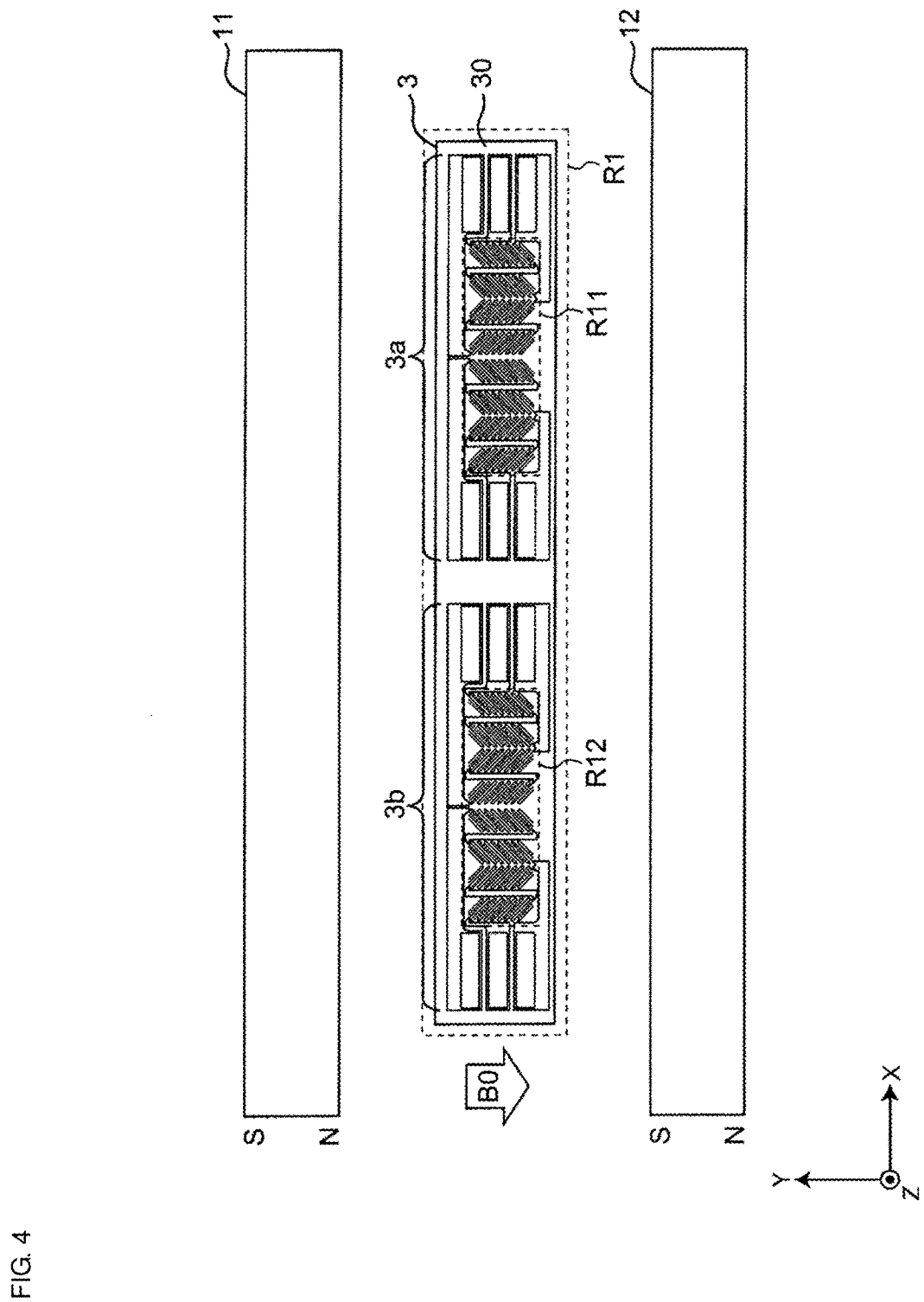
FIG. 4 shows an arrangement example of a sensor chip in the magnetic sensor.

The details of the sensor chip 3 in the magnetic sensor are described with reference to FIG. 4. FIG. 4 shows an arrangement example of the sensor chip 3 in the magnetic sensor 10. FIG. 4 corresponds to an enlarged view of the sensor chip 3 and its surroundings in FIG. 3.

As shown in FIG. 4 as an example, the sensor chip 3 in the first preferred embodiment includes two magnetic devices 3a and 3b aligned or substantially aligned in the width direction and a substrate 30 including a principal surface. One example of the substrate 30 may be a silicon substrate and can be made of a wafer of any kind. The width of the sensor chip 3 may preferably be set at, for example, a value that is not less than about twice and not more than about ten times the depth of the sensor chip 3. The sensor chip 3 is mounted and the principal surface of the substrate 30 is parallel or substantially parallel with a mounting surface, for example, the XY plane.

The first and second magnetic devices 3a and 3b include magnetic sensing regions R11 and R12, respectively, where magnetic fields along the principal surface of the substrate 30 are sensed. The magnetic sensing regions R11 and R12 are formed by laminating magnetic films and the like on the substrate 30. Electrodes are provided adjacent to or in a vicinity of the magnetic sensing regions R11 and R12. A protective film preferably made of, for example, silicon dioxide, may be provided on the magnetic sensing regions R11 and R12 and the various electrodes. Each of the magnetic sensing regions R11 and R12 has a dimension in the width direction longer than that in the depth direction of the sensor chip 3, as shown in, for example, FIG. 4. The width of each of the magnetic sensing regions R11 and R12 may preferably be, for example, about twice or more the depth of each of the magnetic sensing regions R11 and R12.

The first magnetic device 3a is closer to the first channel 21 than to the second channel 22 in the state where the magnetic sensor 10 is attached to the busbar 2 (FIG. 1). The second magnetic device 3b is closer to the second channel 22 than to the first channel 21. Because the plurality of magnetic devices 3a and 3b are provided on the single sensor chip 3, variations in characteristics between the magnetic devices 3a and 3b can be reduced. In addition, because a temperature is conveyed on the same sensor chip 3, temperature variations between the magnetic devices 3a and 3b can also be significantly reduced or prevented. The details of the magnetic devices 3a and 3b are described below.

In the example in FIG. 4, each of the bias magnets 11 and 12 has a shape extending along a direction orthogonal or substantially orthogonal to the direction in which its S pole and N pole are aligned. The longitudinal direction of each of two bias magnets 11 and 12 is parallel or substantially parallel with the X direction within tolerance. Between the two bias magnets 11 and 12, the N pole of one of them is opposed to the S pole of the other.

A bias magnetic field B0 along the Y direction is distributed between the bias magnets 11 and 12. With magnetic bias that applies the bias magnetic field B0 to the magnetic devices 3a and 3b, the sensitivity when a magnetic field in a direction crossing the direction of the application is input into the magnetic devices 3a and 3b can be adjusted. This enables setting a dynamic range of the magnetic sensor 10.

In the arrangement example in FIG. 4, the sensor chip 3 is arranged in a central region R1 between the two bias magnets 11 and 12 in the Y direction. The region R1 has the distribution of the bias magnetic field B0 being uniform in the X direction. Because the sensor chip 3 extends along the X direction in the region R1, the magnetic bias of each of the magnetic devices 3a and 3b can be made uniform. By reducing the depth of the sensor chip 3, the gap between the bias magnets 11 and 12 can be narrowed, and the magnetic sensor 10 can be miniaturized.

In the sensor chip 3, the area of the region other than the magnetic sensing regions R11 and R12 may preferably be, for example, about 20% or more of the whole area of the principal surface. From the viewpoint of more significantly reducing or preventing rotational misalignment of the sensor chip 3, the area of the region other than the magnetic sensing regions R11 and R12 may preferably be, for example, about 30% or more, about 40% or more, or about 50% or more of the whole area of the principal surface.

The electrodes on the principal surface of the sensor chip 3 may preferably have an area, for example, that is about 50% or more of the area of the region other than the magnetic sensing regions R11 and R12. When the area of the electrodes is increased, the resistance of the electrodes can be lowered, and heat generation while the magnetic devices 3a and 3b are driven can be reduced. A joined section of wiring or the like can have a sufficient area, and the reliability of prevention of breaks and the like in wires can be improved.

1-1-1. About Magnetic Devices

The details of the magnetic devices 3a and 3b in the sensor chip 3 are described with reference to FIGS. 5 and 6. The first and second magnetic devices 3a and 3b have the same or similar features and elements. An example of one of them, the magnetic device 3a, is described below.

Figure 5:
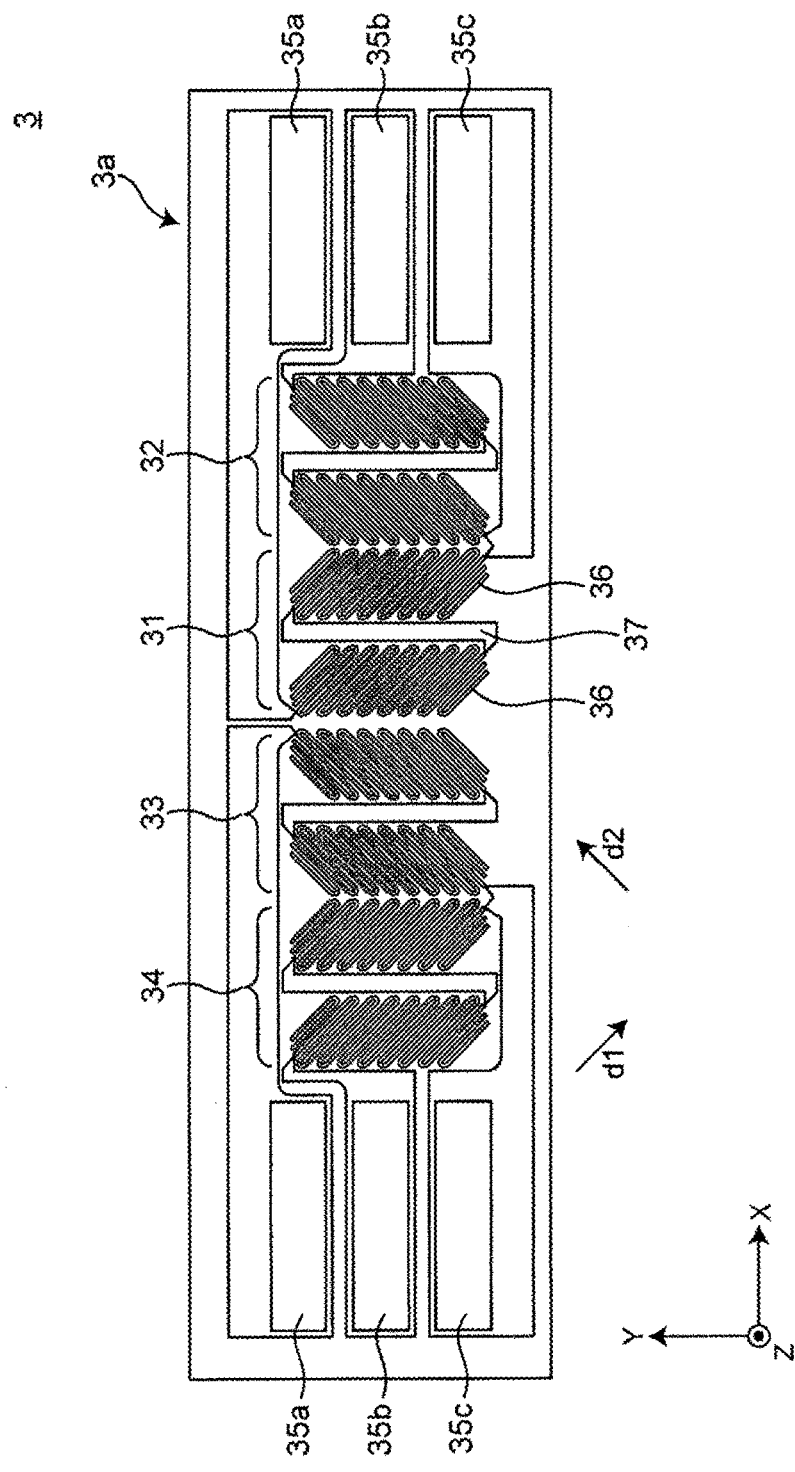
FIG. 5 is a plan view that shows an example of a magnetic device in the sensor chip.

FIG. 5 is a plan view that shows the example of the magnetic device 3a in the sensor chip 3. FIG. 6 is a circuit diagram that shows, as an example, the magnetic device 3a in the magnetic sensor 10. FIG. 6 shows an equivalent circuit of the magnetic device 3a in the example in FIG. 5.

In FIG. 5, the magnetic device 3a includes a plurality of magnetic resistance devices 31, 32, 33, and 34 and a plurality of electrode pads 35a, 35b, and 35c. The group of the electrode pads 35a to 35c and the group of the magnetic resistance devices 31 to 34 are aligned or substantially aligned in the magnetic sensing direction (X direction) of the magnetic device 3a.

Figure 6:
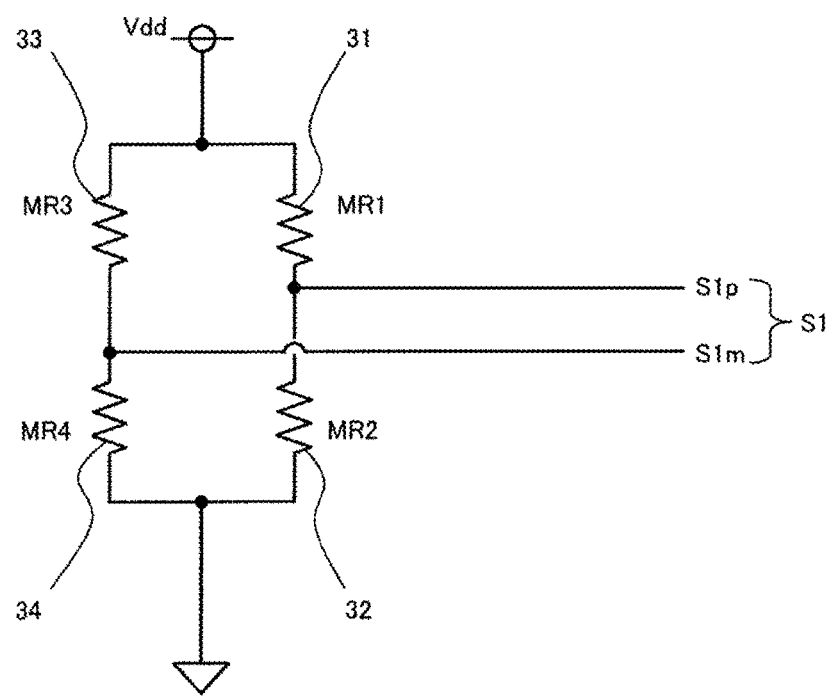
FIG. 6 is a circuit diagram that shows, as an example, the magnetic device in the magnetic sensor.

The four magnetic resistance devices 31 to 34 in the magnetic device 3a in the example in FIG. 5 define a full-bridge circuit (Wheatstone bridge circuit), as shown in FIG. 6. The magnetic device 3a may be driven by, for example, a constant or substantially constant voltage of a power supply voltage Vdd. One example of each of the magnetic resistance devices 31 to 34 may be an anisotropic magnetoresistance (AMR) device.

In this example, of the four magnetic resistance devices 31 to 34, the first and second magnetic resistance devices 31 and define a series circuit, the third and fourth magnetic resistance devices 33 and 34 define another series circuit, and these serial circuits are connected in parallel. The electrode pads 35a to 35c are provided to each of the series circuits (i.e., half-bridge circuits).

The power supply voltage Vdd for the magnetic device 3a is supplied from, for example, the electrode pad 35a in FIG. 5 to the node between the first and third magnetic resistance devices 31 and 33, as shown in FIG. 6. The node between the second and fourth magnetic resistance devices 32 and 34 is grounded at, for example, the electrode pad 35b in FIG. 5.

The node between the first and second magnetic resistance devices 31 and 32 has a potential Sip (FIG. 6) and is connected to one electrode pad 35c of the two electrode pads 35c (FIG. 5). The node between the third and fourth magnetic resistance devices 33 and 34 has a potential Sim and is connected to the other electrode pad 35c. The potentials Sip and Sim vary with respect to, for example, Vdd/2 as a midpoint potential. In this example, the magnetic device 3a generates sensor signals S1 as differential signals based on the two potentials Sip and Sim.

The first and fourth magnetic resistance devices 31 and 34 have magnetic resistance values MR1 and MR4, respectively, which have a common tendency of increase and decrease to a magnetic field input into the magnetic device 3a. The second and third magnetic resistance devices 32 and 33 have magnetic resistance values MR2 and MR3, respectively, which have a tendency of increase and decrease opposite to the tendency of the first and fourth magnetic resistance values MR1 and MR4 of the first and fourth magnetic resistance devices 31 and 34.

Each of the first and fourth magnetic resistance devices 31 and 34 preferably has a meander shape in which it reciprocates in a common direction d1. The direction d1 obliquely extends at an inclination of about 45 degrees to the magnetic sensing direction (X direction). Each of the second and third magnetic resistance devices 32 and 33 preferably has a meander shape in which it reciprocates in a direction d2 orthogonal or substantially orthogonal to the direction d1. In each of the magnetic resistance devices 31 to 34, for example, extending portions in its meander shape are made of a magnetic thin film, and returning end portions are made of a conductive member or the like.

The four magnetic resistance devices 31 to 34 are aligned or substantially aligned in the width direction (X direction) in the magnetic sensing region R11 (FIG. 4). In each of the magnetic resistance devices 31 to 34, a plurality of partial resistance devices 36 are connected in series with each other with a connection electrode 37 interposed therebetween. The partial resistance devices 36 in each of the magnetic resistance devices 31 to 34 are aligned or substantially aligned in the magnetic sensing direction.

In the above-described arrangement of the magnetic resistance devices 31 to 34, the magnetic sensing region R11 in this example extends in the width direction of the sensor chip 3, as shown in FIG. 4. The arrangement is not limited to this example, and the magnetic resistance devices 31 to 34 can be appropriately configured such that the magnetic sensing region R11 (FIG. 4) extends.

The above features of the magnetic device 3a are provided as an example, and preferred embodiments of the present invention are not particularly limited thereto. For example, the magnetic device 3a may be a half-bridge circuit. The magnetic resistance devices 31 to 34 are not limited to AMR devices and may be various types of MR devices, including giant magnetoresistance (GMR) devices, tunnel magnetoresistance (TMR) devices, ballistic magnetoresistance (BMR) devices, and colossal magnetoresistance (CMR) devices.

As the magnetic device 3a, a magnetic device including a Hall device, a magnetic device including a magnetoimpedance (MI) device using the magnetoimpedance effect, a flux-gate magnetic device, or the like, for example, may be used. As the method that drives the magnetic device 3a, constant-current driving, pulse driving, or the like, for example, may be used.

1-2. Circuitry of Current Sensor

Figure 7:
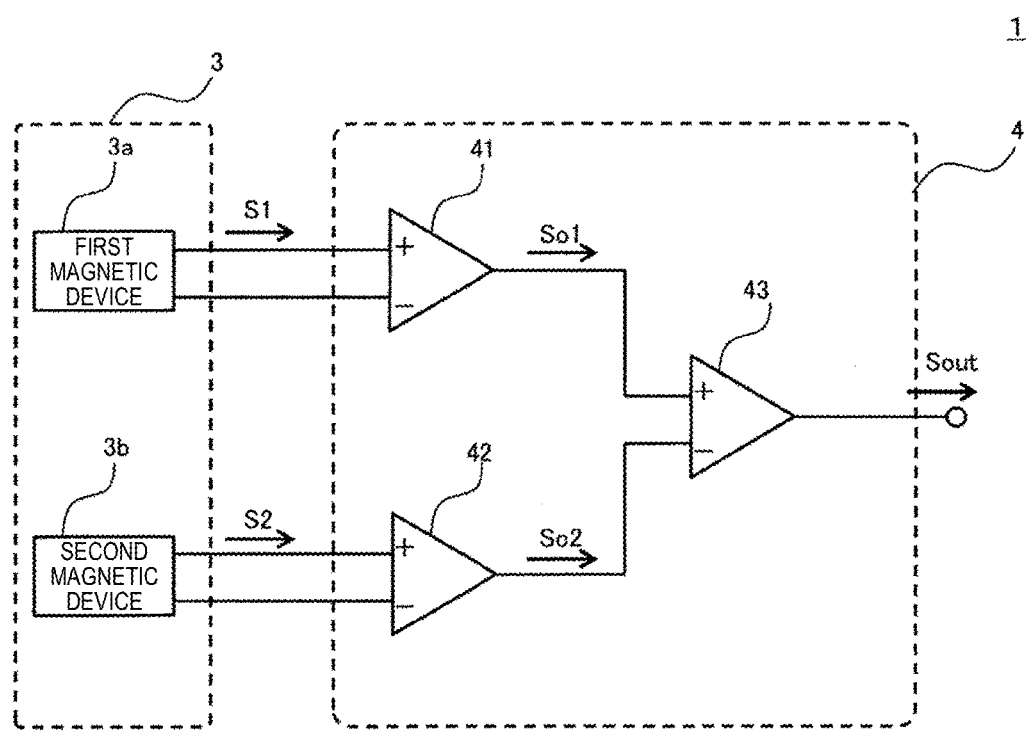
FIG. 7 is a circuit diagram that shows, as an example, the current sensor according to the first preferred embodiment of the present invention.

Circuitry of the current sensor 1 that measures a current by using the two magnetic devices 3a and 3b in the above-described sensor chip 3 is described with reference to FIG. 7. FIG. 7 is a circuit diagram that shows, as an example, the current sensor 1 according to the first preferred embodiment.

In the example in FIG. 7, the current sensor 1 includes the two magnetic devices 3a and 3b and an operational unit 4. The operational unit 4 includes three operational amplifiers 41, 42, and 43. Each of the three operational amplifiers 41 to 43 has an intrinsic gain.

The nodes for the potentials Sip and Sim in the first magnetic device 3a (FIG. 6) are connected to their respective differential input terminals in the first operational amplifier 41 with their respective electrode pads 35c (FIG. 5) interposed therebetween. Similarly, the second magnetic device 3b is connected to differential input terminals in the second operational amplifier 42.

The first operational amplifier 41 differentially amplifies the sensor signals S1 from the first magnetic device 3a and generates a signal So1, which results from the amplification. The second operational amplifier 42 differentially amplifies sensor signals S2 from the second magnetic device 3b and generates a signal So2, which results from the amplification. An output terminal in the first operational amplifier 41 and an output terminal in the second operational amplifier 42 are connected to their respective differential input terminals in the third operational amplifier 43.

The third operational amplifier 43 differentially amplifies the signal So1 from the first operational amplifier 41 and the signal So2 from the second operational amplifier 42 and generates an output signal Sout. The output signal Sout indicates a result of measurement of a current by the current sensor 1. The third operational amplifier 43 may include, for example, a temperature compensating circuit for a gain and/or offset. With this circuit, the current sensor 1 can perform temperature compensation on the output signal Sout.

The above-described circuitry of the current sensor 1 is an example, and the preferred embodiments of the present invention are not particularly limited thereto. For example, in addition to or in place of the temperature compensating circuit in the third operational amplifier 43, various temperature compensating circuits may be included in the first and second operational amplifiers 41 and 42. Each of the first and second magnetic devices 3a and 3b may have a single-ended output terminal. In this case, in place of the first and second operational amplifiers 41 and 42, single-ended amplifiers, buffer amplifiers, or the like, for example, may be used, or they may be omitted.

The operational unit 4 may include various semiconductor integrated circuits and the like that perform various functions of the current sensor 1. For example, the operational unit 4 may include a hardware circuit, such as a dedicated electronic circuit designed to perform a predetermined function or a reconfigurable electronic circuit, for example, application-specific integrated circuit (ASIC) or field-programmable gate array (FPGA). The operational unit 4 may include, for example, a central processing unit (CPU) or the like that performs a predetermined function in cooperation with software. The operational unit 4 may include an internal memory, such as flash memory, for example, and the internal memory may store various kinds of data, programs, and the like. The operational unit 4 can be configured as a semiconductor IC of any kind, such as a CPU, a microprocessing unit (MPU), a microcomputer, a digital signal processor (DSP), an FPGA, and an ASIC, for example.

One example of the operational unit 4 may be mounted inside the package 10a in FIG. 2, together with the sensor chip 3 and the like. The operational unit 4, sensor chip 3, and the like may be mounted on various substrates, including a glass epoxy substrate or an alumina substrate, or may be mounted directly on a metal lead frame inside the package 10a. The positional relationship of sections on the substrate on which they are mounted is not particularly limited, and any relationship can be selected in consideration of the magnetic sensing direction.

The method for fixing the magnetic devices 3a and 3b in the sensor chip 3 and the lead frame is not particularly limited, and one typical fixing method is the one using a die-bonding material. The die-bonding material may be conductive or nonconductive.

2. Operations

Operations of the current sensor 1 having the above-described circuitry and features are described below.

2-1. Operation of Measuring Current

Figure 8:
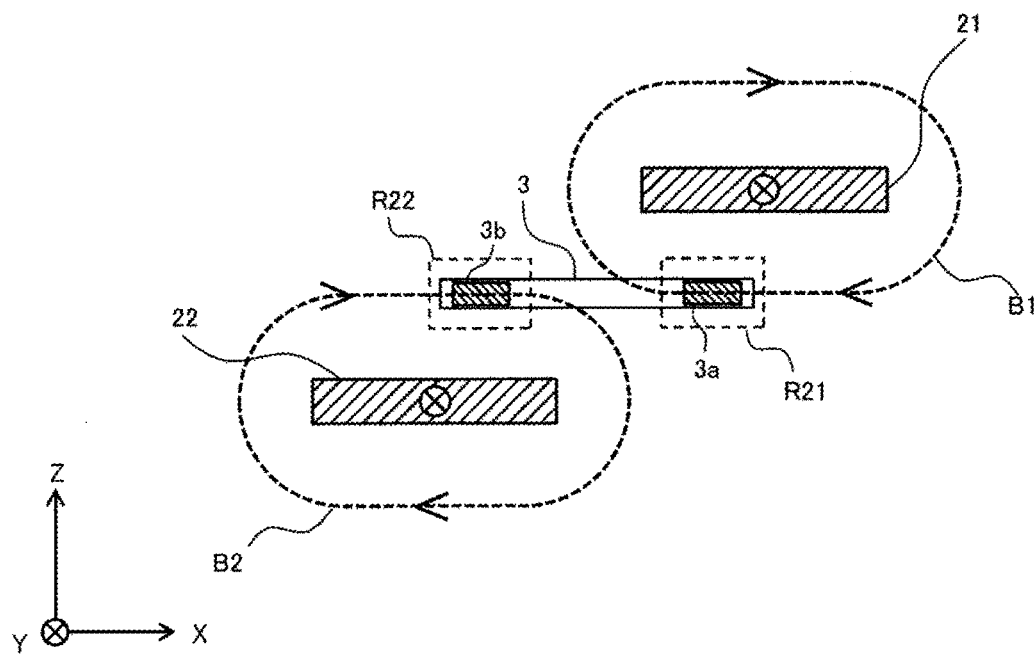
FIG. 8 shows an operation of the current sensor.

An operation of measuring a current by the current sensor according to first preferred embodiment is described with reference to FIG. 8. FIG. 8 shows the operation of the current sensor 1. FIG. 8 shows the channels 21 and 22 and the magnetic devices 3a and 3b adjacent to or in a vicinity of the A-A' cross section in FIG. 1.

FIG. 8 shows, as an example, a signal magnetic field B1 occurring adjacent to or in a vicinity of the first channel 21 and a signal magnetic field B2 occurring adjacent to or in a vicinity of the second channel 22 when a current to be detected flows through the busbar 2 in the +Y direction (see FIG. 1). In the busbar 2, the current is split into portions flowing in the first channel 21 and flowing in the second channel 22. Thus, as shown in FIG. 8, the signal magnetic field B1 adjacent to or in a vicinity of the first channel 21 circles around the first channel 21, and the signal magnetic field B2 adjacent to or in a vicinity of the second channel 22 circles around the second channel 22.

In the current sensor 1 according to the first preferred embodiment, because the current flows in the same direction (e.g., +Y direction) in the first channel 21 and in the second channel 22, the signal magnetic field B1 adjacent to or in a vicinity of the first channel 21 and the signal magnetic field B2 adjacent to or in a vicinity of the second channel 22 have the same circling direction (e.g., clockwise direction). Therefore, as shown in FIG. 8, an X component of the signal magnetic field B1 passing through a region R21 adjacent to or in a vicinity of the first channel 21 and an X component of the signal magnetic field B2 passing through a region R22 adjacent to or in a vicinity of the second channel 22 between the first and second channels 21 and 22 are in mutually opposite directions.

Thus, in the current sensor 1 according to the first preferred embodiment, the first magnetic device 3a is arranged in the above-described region R21 adjacent to or in a vicinity of the first channel 21, and the second magnetic device 3b is arranged in the region R22 adjacent to or in a vicinity of the second channel 22. Thus, the signal magnetic fields B1 and B2 with the mutually opposite phases are input into the two magnetic devices 3a and 3b, respectively.

The first magnetic device 3a generates the sensor signals S1 corresponding to the input magnetic field as a result of detection of the signal magnetic field B1 adjacent to or in a vicinity of the first channel 21 (see FIG. 7). The second magnetic device 3b generates the sensor signals S2 corresponding to the input magnetic field as a result of detection of the signal magnetic field B2 adjacent to or in a vicinity of the second channel 22.

Here, it is assumed that the magnetic fields input into the magnetic devices 3a and 3b include not only the signal magnetic fields B1 and B2 but also noises, such as disturbance magnetic fields. Such noises are assumed to be input into the magnetic devices 3a and 3b with the same or substantially the same phase (in the same or substantially the same direction and with substantially the same magnitude) when the two magnetic devices 3a and 3b are arranged in near positions.

Thus, in the current sensor 1 according to the first preferred embodiment, the operational unit 4 calculates differential amplification of results of sensing in the two magnetic devices 3a and 3b and outputs the output signal Sout as a result of measurement of the current. Thus, noises with the same or substantially the same phase that can be included in the results of sensing in the magnetic devices 3a and 3b can be cancelled out, and the accuracy of measurement of the current based on the signal magnetic fields B1 and B2 can be improved.

2-2. About Angular Misalignment

Figure 9:
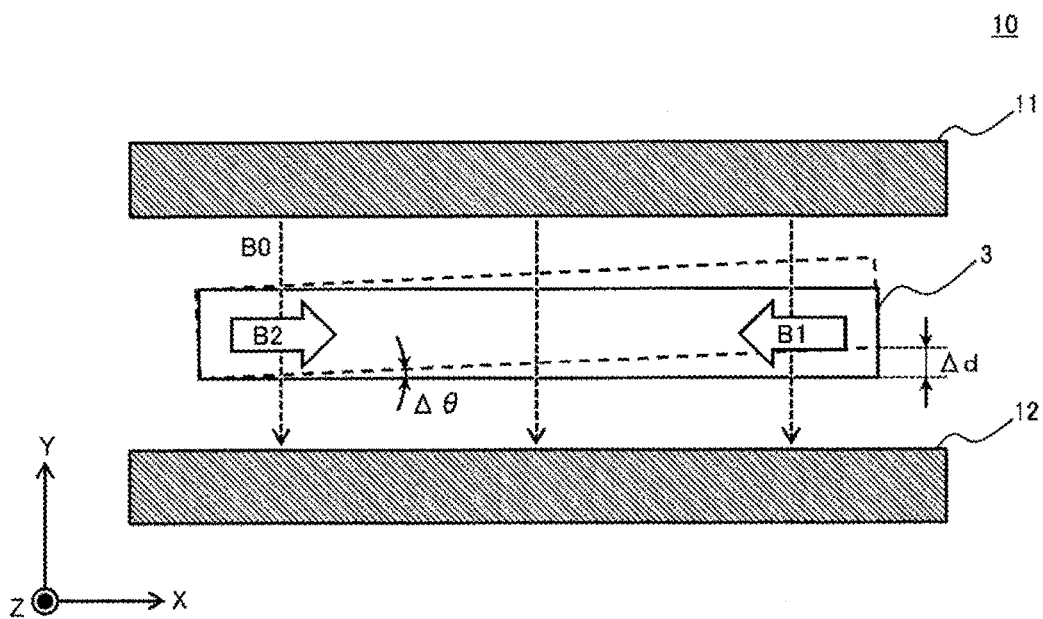
FIG. 9 shows an angular misalignment in the current sensor.

For the above-described magnetic sensor 10 in the current sensor 1, it is important to reduce angular misalignment when the sensor chip 3 is mounted in a compact manner or the like. The angular misalignment in the magnetic sensor 10 is described with reference to FIG. 9. FIG. 9 shows the angular misalignment of the sensor chip 3 in the magnetic sensor 10.

As shown in FIG. 9, the magnetic sensor 10 is assumed to have positional misalignment $\Delta d$ of the sensor chip 3. For example, it is assumed that the positional misalignment $\Delta d$ corresponding to one pixel of a monitor in a die bonder or the like occurs when the sensor chip 3 is placed between the bias magnets 11 and 12 by the die bonder.

When the positional misalignment $\Delta d$ is present, for example, the angle of the sensor chip 3 with respect to the direction of the bias magnetic field B0 is misaligned, and the bias magnetic field B0 may include a component parallel or substantially parallel with the magnetic sensing direction. If the angular misalignment based on the positional misalignment $\Delta d$ is increased, an incorrect input of the bias magnetic field B0 into the magnetic sensor 10 may occur, or the accuracy of sensing the signal magnetic fields B1 and B2 may decrease.

Accordingly, in the first preferred embodiment, the sensor chip 3 in the magnetic sensor 10 has a shape that is long in the width direction, that is, the magnetic sensing direction. Thus, as shown in FIG. 9, if the positional misalignment $\Delta d$ is present in the depth direction of the sensor chip 3, angular misalignment $\Delta\theta$ corresponding to the positional misalignment $\Delta d$ can be reduced by the amount corresponding to the length of the sensor chip 3 in the width direction.

When the angular misalignment $\Delta\theta$ is reduced, as described above, incorrect inputs of the bias magnetic field B0 can be significantly reduced or prevented. In addition, the symmetry of the output signal Sout with respect to the positive and negative sides of a current can be improved, and the accuracy of sensing the signal magnetic fields B1 and B2 can be improved. Because the length of the sensor chip 3 in the depth direction is short, the area of the chip can be reduced, and the magnetic sensor 10 can be miniaturized.

The inventors of preferred embodiments of the present invention conducted a detailed study of the advantageous effects of reduction in the angular misalignment based on the shape of the above-described sensor chip 3 and the like and performed a simulation. The simulation performed by the inventors of preferred embodiments of the present invention is described below.

2-2-1. About Simulation

The simulation of the angular misalignment in the magnetic sensor 10 performed by the inventors of preferred embodiments of the present invention is described with reference to FIGS. 9 to 12.

The inventors of preferred embodiments of the present invention calculated numerical values of the angular misalignment $\Delta\theta$ corresponding to the positional misalignment $\Delta d$ having a predetermined magnitude (FIG. 9) in the simulation in which the width of the sensor chip 3 (hereinafter referred to as "chip width") was changed. In this simulation, the magnitude of the positional misalignment $\Delta d$ was set at about 10 μm in consideration of the positional misalignment corresponding to one pixel in a typical die bonder. The depth of the sensor chip 3 was set at about 5 μm as a fixed value. The result of this simulation is indicated in FIG. 10.

Figure 10:
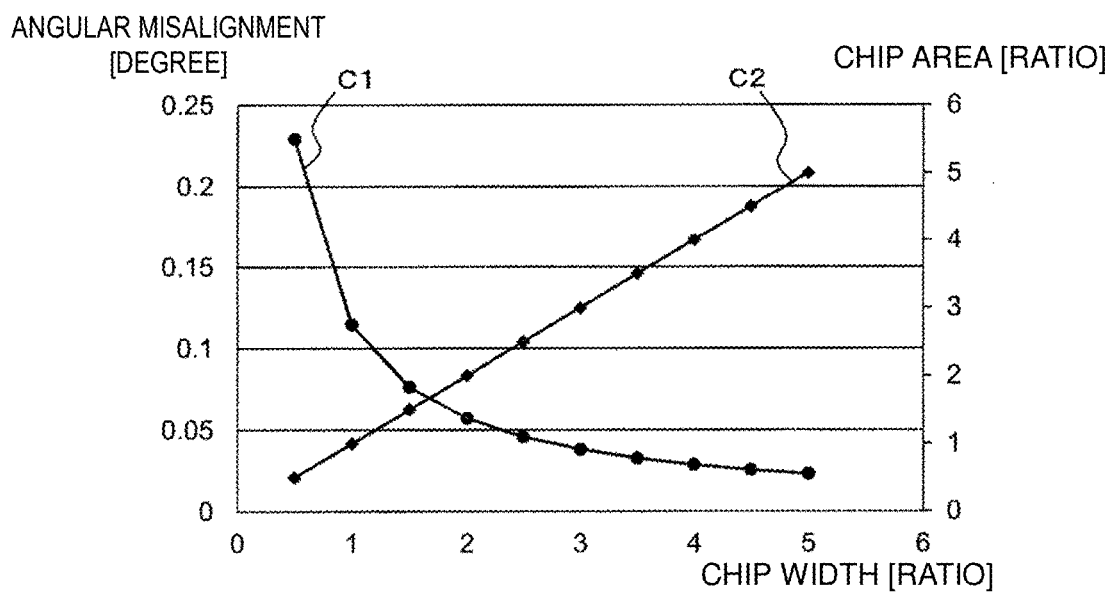
FIG. 10 includes graphs of the angular misalignment and an area of the sensor chip in a simulation.

FIG. 10 shows graphs of the angular misalignment and the area of the sensor chip 3 in the simulation. In FIG. 10, the horizontal axis indicates the chip width of the sensor chip 3 as the ratio to the above-described depth (fixed value). The left vertical axis in this drawing indicates the angular misalignment [degree], and the right vertical axis indicates the area of the sensor chip 3 [ratio]. The ratio of the area of the sensor chip 3 is calculated with respect to the area when the ratio of the chip width is about one.

A graph C1 in FIG. 10 corresponds to the left vertical axis in the drawing and indicates the angular misalignment in the above-described simulation result. The graph C1 reveals that the angular misalignment reduces with an increase in the chip width of the sensor chip 3. Specifically, when the sensor chip 3 is a square (ratio is one), the angular misalignment is not less than about 0.1 degrees. In contrast, when the chip width exceeds twice the depth, the angular misalignment is reduced to about 0.05 degrees.

A graph C2 in FIG. 10 corresponds to the right vertical axis in the drawing and indicates the area of the sensor chip 3 at various chip widths. The graph C2 reveals that when the chip width of the sensor chip 3 increases, the area of the sensor chip 3 increases. From the viewpoint of miniaturization of the sensor chip 3 and the number of pieces extracted from a wafer, the sensor chip 3 is preferably small. Thus, the inventors of preferred embodiments of the present invention calculated numerical values of the ratio of the chip width of the sensor chip 3 (aspect ratio) at which the angular misalignment can be reduced while the increase in the area of the sensor chip 3 is significantly reduced or prevented, as described below.

Figure 11:
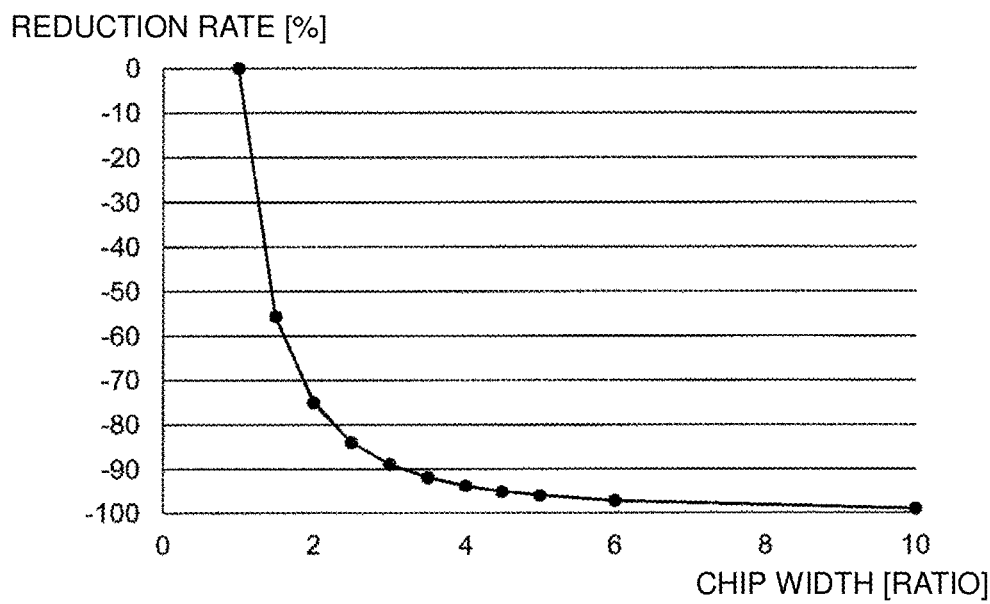
FIG. 11 is a graph that indicates a relationship between a chip width of the sensor chip and the angular misalignment per unit area.

FIG. 11 is a graph that indicates the relationship between the chip width of the sensor chip 3 and the angular misalignment per unit area. The horizontal axis in FIG. 11 indicates the chip width of the sensor chip 3, as in FIG. 10. The vertical axis in FIG. 11 indicates the reduction rate [%] of the angular misalignment of the sensor chip 3 per unit area with respect to the angular misalignment when the ratio of the chip width is about one.

In the numerical calculation in FIG. 11, the angular misalignment of the sensor chip 3 for each chip width was converted into the amount of misalignment per unit area on the basis of the graphs C1 and C2 in FIG. 10. The reduction rate of the angular misalignment per unit area was calculated by standardizing the amount of misalignment produced by the conversion by using the amount of misalignment when the ratio of the chip width to the depth is about one.

The result of calculation in FIG. 11 reveals that the reduction rate of the angular misalignment has a sharp gradient adjacent to or in a vicinity of a ratio of about two and the gradient gradually becomes gentle. For example, when the chip width of the sensor chip 3 is set at a value that is not less than about twice and not more than about ten times the depth, the reduction rate of the angular misalignment that is not less than about 75% of that when the ratio of the chip width is one is obtainable, and the increase in the area can be significantly reduced or prevented to about ten times or less.

The ratio of the chip width can be appropriately selected from the viewpoint of the rate of change of the reduction rate of the angular misalignment and the area of the sensor chip 3 in accordance with the extension of the chip width. For example, when the chip width of the sensor chip 3 is about 2.5 times or more the depth, about 80% or more of the angular misalignment when the ratio of the chip width is one can be reduced. When the chip width is about 3.5 times or more, about 90% or more of the angular misalignment can be reduced. When the chip width is about 4.5 times or more, about 95% or more of the angular misalignment can be reduced.

The inventors of preferred embodiments of the present invention performed numerical analysis of the shape of the sensor chip 3 from the viewpoint of compatibility between decreasing the area of the sensor chip 3 and the reduction in the angular misalignment. The numerical analysis of the chip shape is described with reference to FIGS. 12A and 12B.

Figure 12A:
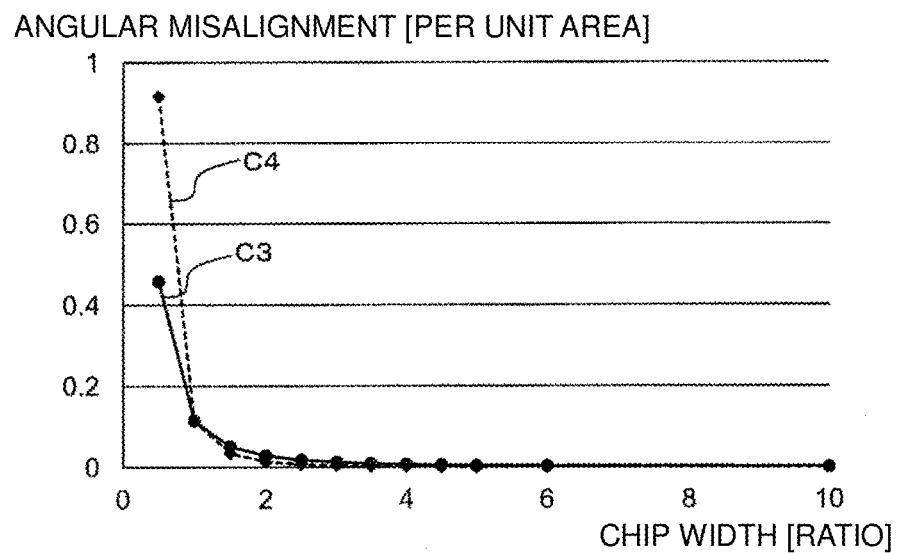
FIGS. 12A and 12B show numerical analysis of chip shapes of the sensor chip.

FIG. 12A shows graphs indicating the angular misalignments in accordance with the chip shape. In FIG. 12A, a graph C3 indicates the angular misalignment (amount of misalignment) per unit area when the chip width of the rectangular sensor chip 3 is changed. The depth of the sensor chip 3 in the graph C3 is fixed, as described above. A graph C4 indicates the angular misalignment per unit area when the chip width of a square chip is changed. The depth of the chip in the graph C4 varies with the magnitude of the chip width.

In the graph C3 and graph C4 in FIG. 12A, when the ratio of the chip width is about one, both of the chips have the same or substantially the same shape and the same or substantially the same area. When the ratio of each of the chip widths is more than one, the graph C4 has a smaller value (vertical axis) than that in the graph C3. The reason may be that the area of the square chip is larger than that of the sensor chip 3. The difference between the graph C3 and graph C4 in accordance with the ratio of the chip width is shown in FIG. 12B.

Figure 12B:
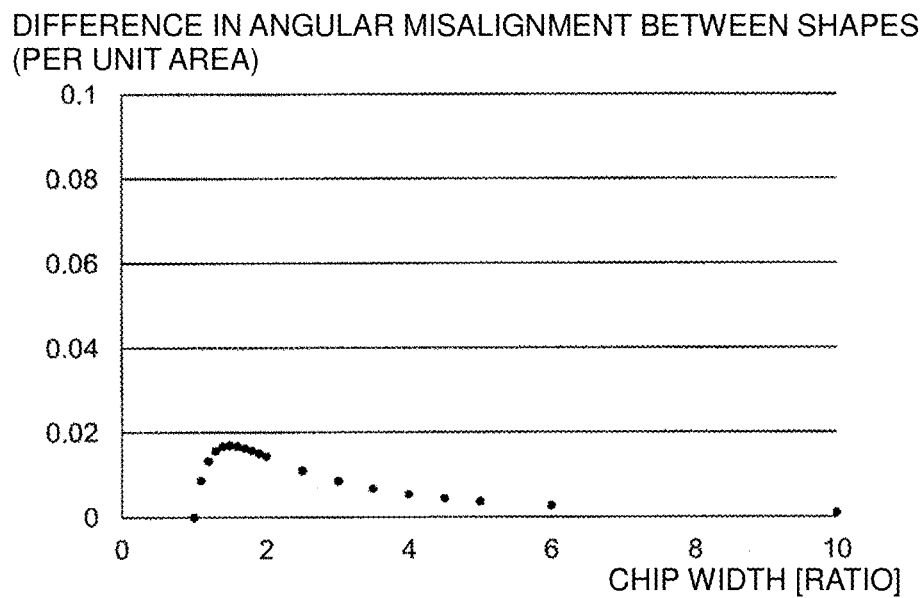

FIG. 12B shows the difference in the angular misalignment per unit area between the shape of the sensor chip 3 and the shape of the square chip. FIG. 12B reveals that the difference in the angular misalignment between the shapes (vertical axis) is the largest adjacent to or in a vicinity of about 1.5 in the ratio of the chip width and has a point of inflection adjacent to or in a vicinity of about two in the ratio. The difference in the angular misalignment between the shapes decreases with an increase in the chip width above about 1.5 in the ratio of the chip width, and its gradient becomes sharper as the ratio approaches two. The gradient of the difference in the angular misalignment between the shapes becomes gentler as the ratio of the chip width becomes larger than two and asymptotically approaches "zero". It is considered that variations in manufacturing the sensor chips 3 can be reduced.

From the above, the advantageous effects achieved by the rectangular shape of the sensor chip 3 being long in the width direction is considered to be noticeable when the ratio of the chip width is not less than about two. For example, from the viewpoint of variations in manufacturing the sensor chips 3, the chip width of each of the sensor chips 3 may be set at a value that is not less than about 1.5 times and not more than about six times. The above-described various analysis results may be applied to the magnetic sensing regions R11 and R12 (FIG. 4) in the sensor chip 3.

3. Summary

As described above, the magnetic sensor 10 according to the first preferred embodiment senses a magnetic field in a magnetic sensing direction by using the width direction of the sensor chip 3 as the magnetic sensing direction. The magnetic sensor 10 includes the sensor chip 3 being an example of a chip on which at least one magnetic device 3a or 3b is provided. The length of the sensor chip 3 in the magnetic sensing direction (width direction) is about twice or more the length of the sensor chip 3 in an orthogonal direction that is orthogonal or substantially orthogonal to the magnetic sensing direction (depth direction).

In the above-described magnetic sensor 10, when the width of the sensor chip 3 is extended to about twice or more the depth, the angular misalignment in the magnetic sensor 10 can be reduced.

The length of the sensor chip 3 in the magnetic sensing direction, that is, the width of the sensor chip 3 may preferably be about 2.5 times or more the length of the sensor chip 3 in the orthogonal or substantially orthogonal direction, that is, the depth of the sensor chip 3. The width of the sensor chip 3 may preferably be about 3.5 times or more or may be about 4.5 times or more the depth of the sensor chip 3. Thus, the angular misalignment in the magnetic sensor 10 can be further reduced.

In the first preferred embodiment, the sensor chip 3 includes the magnetic sensing regions R11 and R12 defined by the magnetic devices 3a and 3b. The magnetic sensing regions R11 and R12 extend in the magnetic sensing direction on the sensor chip 3. The width of each of the magnetic sensing regions R11 and R12 may be about twice or more or may be about 2.5 to about 4.5 times or more the depth.

In the first preferred embodiment, the two magnetic devices 3a and 3b are aligned or substantially aligned in the magnetic sensing direction on the sensor chip 3. Each of the magnetic devices 3a and 3b has a meander shape obliquely extending in the magnetic sensing direction. Each of the magnetic devices 3a and 3b includes the plurality of magnetic resistance devices 31 to 34 defining a bridge circuit. The plurality of magnetic resistance devices 31 to 34 may be aligned or substantially aligned in the magnetic sensing direction on the sensor chip 3.

In the first preferred embodiment, the magnetic sensor 10 further includes the electrode pads 35a to 35c that energize the magnetic devices 3a and 3b. The group of the electrode pads 35a to 35c and the group of the magnetic devices 3a and 3b are aligned or substantially aligned in the magnetic sensing direction on the sensor chip 3. Thus, the sensor chip 3 can extend in the magnetic sensing direction.

In the first preferred embodiment, the magnetic sensor further includes the magnets 11 and 12 adjacent to or in a vicinity of the sensor chip 3 in the orthogonal or substantially orthogonal direction. The magnets 11 and 12 enable magnetic bias to be provided to the sensor chip 3 in the orthogonal or substantially orthogonal direction. In the sensor chip 3 according to the first preferred embodiment, incorrect inputs of the bias magnetic field B0 can be significantly reduced or prevented, and the linearity of outputs of the magnetic sensor 10 can be enhanced. The number of the magnets in the magnetic sensor 10 is not limited to 2, and it may be 3 or more, or may be 1.

The current sensor 1 according to the first preferred embodiment includes the magnetic sensor 10 and the busbar 2 that is an example of a conductor that allows a current to flow therethrough. The magnetic sensor 10 is attached to the busbar 2. The magnetic sensor 10 senses the signal magnetic fields B1 and B2 produced by the current. In the current sensor 1 according to the first preferred embodiment, the angular misalignment with respect to the directions of the signal magnetic fields B1 and B2 produced by the current can be reduced.

In the first preferred embodiment, the busbar 2 includes the two channels 21 and 22 that allow a current to flow therethrough. In the magnetic sensor 10, the two magnetic devices 3a and 3b are aligned or substantially aligned in the magnetic sensing direction, and the two magnetic devices 3a and 3b are opposed to the two channels 21 and 22, respectively. The signal magnetic fields B1 and B2 around the two channels 21 and 22 are sensed by the two magnetic devices 3a and 3b, thus enabling noises with the same or substantially the same phase to be cancelled out and the accuracy of measurement of currents to be improved.

In the first preferred embodiment, the attachment section 10c protruding from the magnetic sensor 10 in the orthogonal or substantially direction and attached to the busbar is provided. By virtue of the attachment section 10c, the angular misalignment occurring when the magnetic sensor 10 is attached to the busbar 2 can be significantly reduced or prevented.

Other Preferred Embodiments

In the above-described first preferred embodiment, the busbar 2 in FIG. 1 is described as one example of the conductor allowing a current being a target for measurement to flow therethrough. The conductor in the current sensor 1 is not limited to this example, and various conductors can be used. A variation of the conductor in the current sensor 1 is described with reference to FIG. 13.

Figure 13:
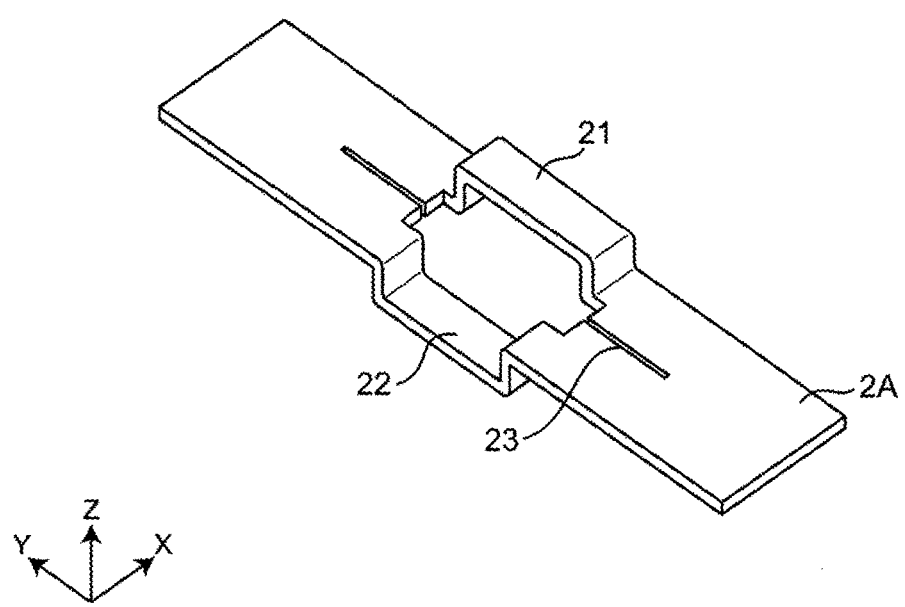
FIG. 13 is a perspective view that shows a variation of a conductor in the current sensor.

FIG. 13 is a perspective view that shows a conductor 2A in the variation in the current sensor. The conductor 2A in the present variation is one in which a positioning section 23 having a predetermined processed shape is provided in the busbar 2 in FIG. 1. The positioning section 23 can be used as a reference in a direction of attaching the magnetic sensor 10 when the magnetic sensor 10 is attached to the conductor 2A in the current sensor 1.

As shown in FIG. 13, for example, the positioning section 23 may be provided as a slit extending in the Y direction between the two channels 21 and 22. The processed shape of the positioning section 23 is not particularly limited and may be, for example, a countersink, a dent, or the like.

As described above, the conductor 2A in the current sensor 1 may include the positioning section 23 defining and functioning as a reference for attaching the magnetic sensor 10. Thus, the angular misalignment in the magnetic sensor 10 to the conductor 2A can be further reduced.

In FIGS. 1 and 13, the conductors 2 and 2A, which are divided into the two channels 21 and 22 in a portion thereof in the Y direction, are described. The preferred embodiments of the present invention are not limited thereto. For example, a conductor divided into two branches as the two channels may be used. Another conductor without two channels may also be used. In this case, two magnetic devices opposed to each other with the conductor interposed therebetween may be used, or the current sensor may be defined by a single magnetic device.

In the above-described preferred embodiments, the sensor chip 3 with the two magnetic devices 3a and 3b is described. The preferred embodiments of the present invention are not limited thereto. The number of the magnetic devices in the sensor chip 3 may be one, or may be three or more.

In the above-described preferred embodiments, the magnetic sensor 10, in which the sensor chip 3 is packaged by the package 10a, is described. The magnetic sensor according to the preferred embodiments may not include the package 10a. For example, the sensor chip 3 may alone define the magnetic sensor. For example, various electrodes and the like on the sensor chip 3 may define terminals for inputs and outputs for the magnetic sensor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising: a magnetic sensor to sense a magnetic field in a predetermined magnetic sensing direction, the magnetic sensor including: a chip on which at least one magnetic device is provided; and a conductor to which the magnetic sensor is attached, the conductor a current to flow therethrough; wherein a length of the chip in the magnetic sensing direction is about twice or more than a length of the chip in an orthogonal direction that is orthogonal or substantially orthogonal to the magnetic sensing direction; the magnetic sensor senses a magnetic field produced by the current; the conductor includes two channels that allow the current to flow therethrough; wherein the two channels are offset from one another in the magnetic sensing direction and the at least one magnetic device is located between the two channels of the conductor.

2. The current sensor according to claim 1, wherein the length of the chip in the magnetic sensing direction is about 2.5 times or more than the length of the chip in the orthogonal direction.

3. The current sensor according to claim 1, wherein the length of the chip in the magnetic sensing direction is about 3.5 times or more than the length of the chip in the orthogonal direction.

4. The current sensor according to claim 1, wherein the length of the chip in the magnetic sensing direction is about 4.5 times or more than the length of the chip in the orthogonal direction.

5. The current sensor according to claim 1, wherein
the chip includes a magnetic sensing region defined by the magnetic device; and
the magnetic sensing region extends in the magnetic sensing direction on the chip.

6. The magnetic sensor according to claim 5, wherein a dimension of the magnetic sensing region in a width direction is about twice or more than a dimension of the magnetic sensing region in a depth direction.

7. The magnetic sensor according to claim 5, wherein
the chip includes a substrate including a principal surface; and
an area of a region that does not include the magnetic sensing region is about 20% or more of an entire area of the principal surface.

8. The current sensor according to claim 1, wherein the at least one magnetic device includes two magnetic devices aligned or substantially aligned in the magnetic sensing direction on the chip.

9. The current sensor according to claim 1, wherein
the magnetic device includes a plurality of magnetic resistance devices defining a bridge circuit; and
the plurality of magnetic resistance devices are aligned or substantially aligned in the magnetic sensing direction on the chip.

10. The current sensor according to claim 1, wherein the magnetic device has a meander shape obliquely extending in the magnetic sensing direction.

11. The current sensor according to claim 1, further comprising:
an electrode pad that energizes a current to the magnetic device; wherein
the electrode pad and the magnetic device are aligned or substantially aligned in the magnetic sensing direction on the chip.

12. The current sensor according to claim 1, further comprising a magnet adjacent to or in a vicinity of the chip in the orthogonal direction.

13. The current sensor according to claim 1, wherein an attachment section protruding from the magnetic sensor and attached to the conductor is provided.

14. The current sensor according to claim 1, wherein the conductor includes a positioning section defining and functioning as a reference that attaches the magnetic sensor.

15. The current sensor according to claim 1, wherein the conductor is a busbar.

16. A current sensor comprising:
a magnetic sensor to sense a magnetic field in a predetermined magnetic sensing direction, the magnetic sensor including
a chip on which two magnetic devices are provided; and
a conductor to which the magnetic sensor is attached, the conductor allowing a current to flow therethrough; wherein
a length of the chip in the magnetic sensing direction is about twice or more than a length of the chip in an orthogonal direction that is orthogonal or substantially orthogonal to the magnetic sensing direction;
the magnetic sensor senses a magnetic field produced by the current;
the conductor includes two channels that allow the current to flow therethrough;
the two magnetic devices in the magnetic sensor are aligned or substantially aligned in the magnetic sensing direction; and
the two magnetic devices in the magnetic sensor are opposed to the two channels, respectively.

17. The current sensor according to claim 16, wherein
the two magnetic devices are located between the two channels of the conductor.

18. The current sensor according to claim 16, wherein the length of the chip in the magnetic sensing direction is about 2.5 times or more than the length of the chip in the orthogonal direction.

19. The current sensor according to claim 16, further comprising a magnet adjacent to or in a vicinity of the chip in the orthogonal direction.

20. The current sensor according to claim 16, wherein the conductor is a busbar.

* * * * *